United States Patent [19]

Kamei et al.

[11] 4,116,722

[45] Sep. 26, 1978

[54] METHOD FOR MANUFACTURING COMPOUND SEMICONDUCTOR DEVICES

[75] Inventors: Kiyoo Kamei, Yokohama; Toshiaki Ikoma, Tokyo; Hirokuni Tokuda, Kawasaki; Jeffrey Frey, Tokyo, all of Japan

[73] Assignees: Tokyo Shibaura Electric Co., Tokyo; Toshiaki Ikoma, Kawasaki, both of Japan

[21] Appl. No.: 825,717

[22] Filed: Aug. 18, 1977

[30] Foreign Application Priority Data

Feb. 24, 1977 [JP] Japan .................................. 52-18721

[51] Int. Cl.² ........................................... H01L 21/26
[52] U.S. Cl. ...................................... 148/1.5; 148/175; 148/187; 156/628; 204/56 R
[58] Field of Search ........................ 148/187, 175, 1.5; 204/56 R; 156/628

[56] References Cited

U.S. PATENT DOCUMENTS

| 2,686,279 | 8/1954 | Barton .............................. 204/56 R |
|---|---|---|
| 3,640,806 | 2/1972 | Watanabe et al. ............... 148/187 X |
| 3,798,139 | 3/1974 | Schwartz ........................... 204/56 R |
| 3,844,904 | 10/1974 | Yahalom ........................... 204/56 R |
| 3,859,178 | 1/1975 | Logan et al. ...................... 204/56 R |
| 3,890,169 | 6/1975 | Schwartz et al. ................. 204/56 R |
| 3,967,981 | 7/1976 | Yamazaki ......................... 148/187 X |
| 3,971,710 | 7/1976 | Romankiw ........................ 204/56 R |
| 4,033,788 | 7/1977 | Hunsperger et al. ................. 148/1.5 |

OTHER PUBLICATIONS

Japanese J. of Applied Physics, vol. 16, Supplement 16-1, pp. 471-474 (1977).

J. Electrochem. Soc., vol. 123, No. 5, pp. 713-723, May 1976.

*Primary Examiner*—G. Ozaki
*Attorney, Agent, or Firm*—Oblon, Fisher, Spivak, McClelland & Maier

[57] ABSTRACT

A method for manufacturing compound semiconductor devices includes a step of forming a first oxidized film on a GaAs body and heating it at a high temperature. A second oxidized film is thereafter formed on the body which includes the first oxidized film so as to change it properties, for example, to be easily etched with an etchant.

6 Claims, 31 Drawing Figures

F I G. 1A
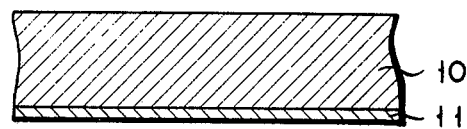
F I G. 1B
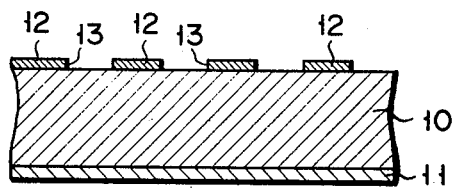
F I G. 1C
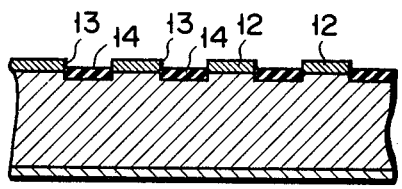
F I G. 1D
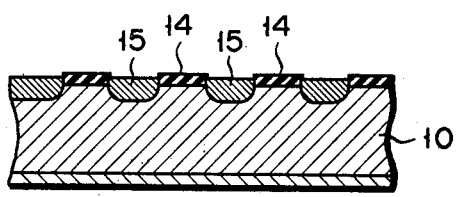
F I G. 1E
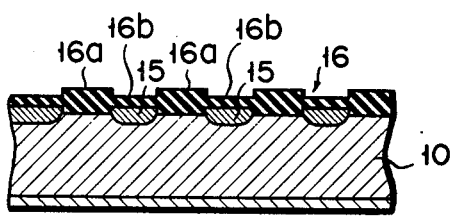
F I G. 1F
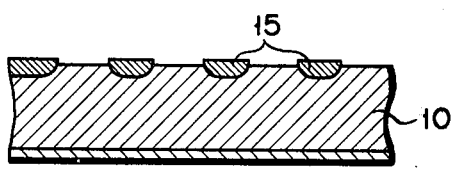
F I G. 1G
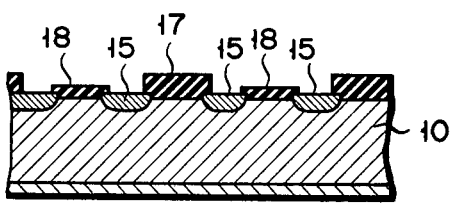

METHOD FOR MANUFACTURING COMPOUND SEMICONDUCTOR DEVICES

Background of the Invention

This invention relates to a method for manufacturing compound semiconductor devices, more specifically, semiconductor devices with a compound insulating film.

There have recently been developed in various fields semiconductor devices with a substrate composed of a compound semiconductor such as GaAs and GaP. When using such compound semiconductor substrate, if the insulating film to be formed thereon is made of well-known $SiO_2$ or $Si_3N_4$, electrical trouble is liable to be caused at the interface between the substrate and insulating film, preventing us from obtaining high-performance devices. To eliminate such a shortcoming, a technique has been recently developed to form an insulating film by oxidizing a surface of the compound semiconductor substrate by the plasma anodic oxidation method or anodic oxidation method. Thus formed insulating film or compound semiconductor oxidized film has advantages in that it will form no degenerated layer between itself and the substrate, it may allow etching with a conventional etchant and the oxidized film may be selectively formed. For example, the insulating film formed by oxidizing a GaAs substrate includes Ga, As and O as the ingredients thereof, and may easily be etched with an acid such as HCl and $H_2SO_4$ or alkaline etchant, such as NaOh. Further the oxidized film may be selectively solidified by a conventional resist. However, even such insulating film, formed in the above-mentioned manner, may be substantially changed in nature by heating at nearly 400° C or above, lowered in specific resistance, rendered unable to be etched with the etchant, and subjected to a degenerated layer formed at the interface between the substrate and insulating film. Since the heat treatment at not much higher than 400° C is limited to use in the regular processes, such as diffusion, alloying, and annealing processes, it cannot be applied after formation of the insulating film in these processes, putting great restrictions on the formation of semiconductor devices.

SUMMARY OF THE INVENTION

Accordingly, an object of this invention is to provide a method for manufacturing compound semiconductor devices for applications in a variety of fields, including forming an insulating film on a surface of a compound semiconductor substrate by oxidizing thereof and then heating such substrate without substantially reducing the final specific resistance of such insulating film, allowing etching with an etchant to remove a degenerated layer formed as a result of such heating.

BRIEF DESCRIPTION OF THE DRAWING

FIG. 1A to 1G are schematic sectional views showing manufacturing steps for the MOS type field effect transistor according to an embodiment of this invention;

DETAILED DESCRIPTION OF THE PREFERRED EMBODIMENTS

Figure 2A:
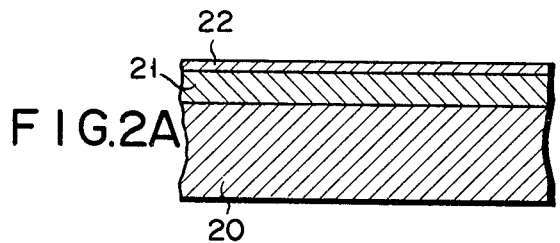
FIGS. 2A to 2J are sectional views for illustrating a manufacturing process for an MES type field effect transistor or a Schottky gate field effect transistor according to another embodiment of the invention.

Now we will describe the method for manufacturing the compound semiconductor device according to an embodiment of this invention.

The manufacturing method as shown in FIGS. 1A to 1G is an application of the spirit of the invention to the manufacture of insulated-gate type field-effect transistors.

First, there is prepared an n-type GaAs substrate 10 with the concentration of electrons of approximately $1 \times 10^{17} cm^{-3}$, and faces bearing of (100) face and mirror polished. One face of the substrate is coated with a metal layer by double evaporation of InSn and Ag, which is heated and alloyed, thus forming an ohmic electrode 11 as shown in FIG. 1A. Then, the other face of the substrate 10 is coated with a photo-resist 12, which is patterned with a suitable mask to form openings 13 as shown in FIG. 1B. Thereafter, the substrate 10 as an anode and a Pt plate, prepared as a negative electrode are opposed to each other in an electrolyte composed of tartaric acid and propylene glycol, and the portions of the substrate 10 exposed through the photo-resist openings 13 are oxidized by the conventional anodic oxidization method in which a direct current of 100V is applied between both electrodes, thus forming an anodized film or insulating film 14 with a thickness of approximately 2,000A in such a manner as shown in FIG. 1C. Subsequently, the resist 12 on the substrate 10 is removed completely with a resist remover, and then zinc is diffused into the substrate in an atmosphere of nitrogen gas at 650° C for two hours with the anodized film 14 as a mask whereby approximately 1.05 μm deep p-type areas 15 are formed in the substrate 10. The surfaces of these resultant p-type areas 15 are surrounded by the anodized film 14, and are thereby separated from each other.

We tried in vain to etch and remove the anodized film 14 from a sample prepared to the extent of the process shown in FIG. 1C in such a manner as described above by using HF or other acid or alkaline chemicals. Also, the specific resistance was actually determined to be substantially reduced. This seems to be attributable to the fact that the anodized film in the process as shown in FIG. 1B is an insulating film composed of Ga, As and O, while the heat treatment at 600° C in the aforesaid diffusion process let As out of the insulating film to the open air to change such film into an oxidized film mainly composed of chemically stable $\beta$-$Ga_2O_3$.

The member in the process as shown in FIG. 1D is again anodized in substantially the same manner as the aforesaid anodic oxidation, thus forming on the surface of the substrate 10, as shown in FIG. 1E, a second anodized film 16 consisting of first portions 16a obtained by thickening said first anodized film 14 and second portions 16b lying adjacently to such first portions 16a and obtained by anodizing the surface of said diffused areas 15. The total thickness of the thickened film portion 16a of the second anodized film 16 includes an oxidized portion, obtained by oxidation of the surface of the substrate 10 right under the first anodized film 14, and the first anodized film 14, though the second anodized film 16 may be considered to be a separately formed film because the first anodized film 14 itself would be also changed by the second anodic oxidation on account of its nature. That is to say, the second oxidized film 16, like the first oxidized film 14 before heating, is made able to be easily etched with the conventional etchant. Further, the main characteristics of the first anodic oxidation are entirely changed by the second anodic oxidation — the reduction in specific resistance is substantially relieved, and the degenerated layer, formed between the first insulating film 14 and the substrate 10 by heating, is removed. The thinner portion 16b of the second anodized film 16 is found to have substantially the same properties as those of the first anodized film before heating.

Thus, after the second anodized film 16 is formed on the substrate 10, the film 16 is dipped in HF and peeled off completely to expose the mirror-like surface as shown in FIG. 1F. Finally, field-oxidized films 17 and gate-oxidized films 18 are respectively formed between the field-effect transistors on the substrate 10 and between the diffused areas 15 of each transistor by anodic oxidation or the like as shown in FIG. 1G, while the electrodes (not shown) are attached to their respective elements.

Now we will describe manufacturing method of a Schottky gate field-effect transistor according to this invention with reference to FIGS. 2A to 2J.

Figure 2F:
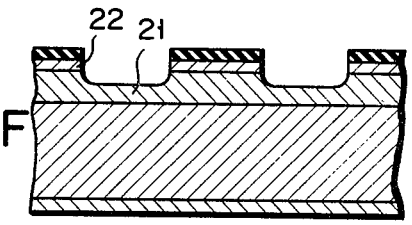
Figure 2B:
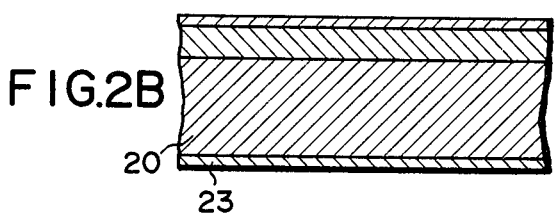
Figure 2G:
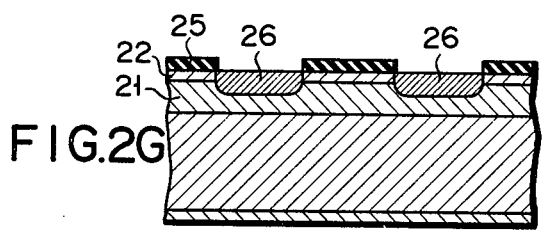
Figure 2C:
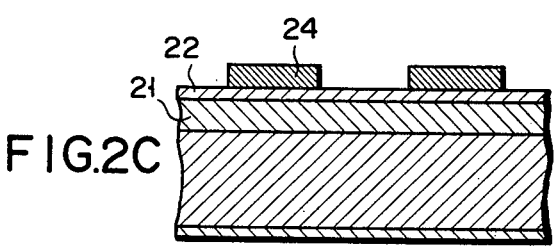
Figure 2H:
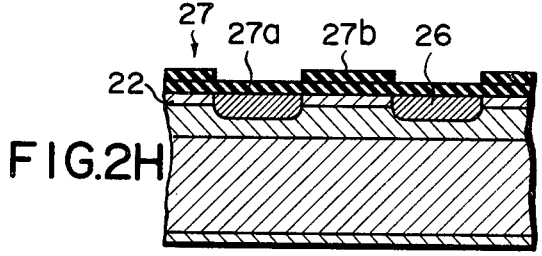
Figure 2D:
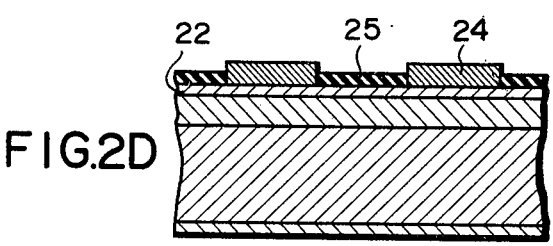
Figure 2I:
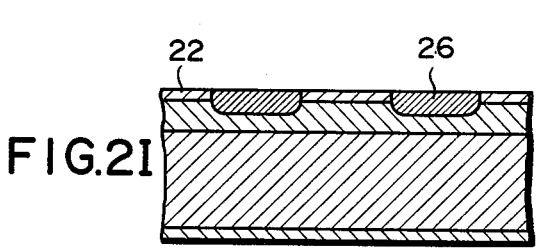
Figure 2E:
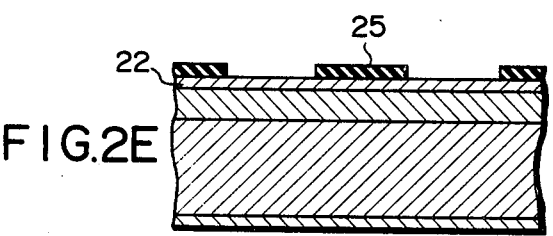
Figure 2J:
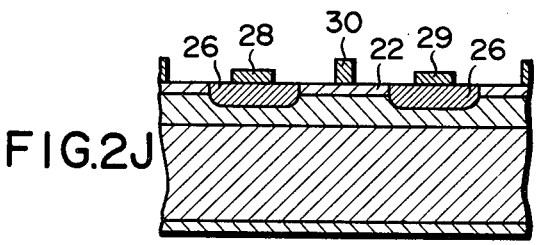

On the top face of (100) face, of a semi-insulating GaAs substrate 20 with the specific resistance of $10^8$ $\Omega°cm$, doped with Cr, is formed a 5 $\mu m$ thick n-type buffer layer 21 with the concentration of electrons of $2 \times 10^{13} cm^{-3}$ by the vapor growth method. Then, on this layer 21 is formed a 0.5 $\mu m$ thick n-type operating layer 22 with the concentration of electrons of $9 \times 10^{16} cm^{-3}$ as shown in FIG. 2A. AuGe is evaporated and applied to the back side of the GaAs substrate 20, and heated in an atmosphere of $H_2$ at 450° C for 5 minutes to be alloyed, thus forming an alloy layer 23 as shown in FIG. 2B. Thereafter, the operating layer 22 is coated with a positive-type photo-resist 24, which is patterned suitably to form a mask as shown in FIG. 2C. Further, with the substrate 20 regarded as an anode, a DC voltage of 200V is applied in the same manner as that of the first embodiment to form an approximately 3,000A thick first anodized film 25 on the portion of the operating layer 22 not covered with the photo-resist 24. Then, the resist 24 is removed from the surface of the operating layer 22, and the portion of the layer 22 covered with the resist 24 is exposed as shown in FIG. 2E. Subsequently, the operating layer 22 and the buffer layer 21 are dipped in a $Br-Ch_3OH$-system etchant, so that the exposed portion of the operating layer 22 is entirely removed and the portion of the buffer layer 21 thereunder is also etched to a depth of 1 $\mu m$ as shown in FIG. 2F. Thereafter, n-type GaAs layers 26 with the concentration of electrons of $2 \times 10^{18} cm^{-3}$ is deposited in the exposed recesses of the buffer layer 21 and operating layer 22 by the vapor growth method as shown in FIG. 2G. Here, it should be noticed that the first anodized film 25 has been changed in nature by heat treatment at 400° C or above for vapor growth, losing its capability of being etched. This is again anodized with an applied voltage of 100V, and a second anodized film 27, containing the first oxidized film therein, is formed all over the operating layer 22 as well as over the GaAs growth layers 26 as shown in FIG. 2H. The second anodized film 27 is composed of a first portion 27a located on the growth layer 26 and sharing the properties with the first anodized film 25 before heating, and a second portion 27b formed on the operating layer 22 with the properties of the first anodized film 25 after heating restored to a degree practically effective. Then, as shown in FIG. 2I, the insulating film is removed completely from the operating layer 22 and the growth layer 26 by dipping it in HCl solution. Further, as shown in FIG. 2J, a source electrode 28 and a drain electrode 29 made of gold are formed on both said diffused layers 26 respectively, while a gate electrode 30 is formed on the operating layer 22 between these source and drain areas 26 by evaporation of aluminum, thereafter annealing at a temperature of 300° C to form a high-output Schottky gate field-effect transistor.

The allowable voltage between source and drain of the transistor thus formed by removing the first anodized film by means of the second anodized film was found to be 12V higher than that of the Schottky field-effect transistor in which the first anodized film is removed by sputtering subsequent to the process as shown in FIG. 2G, and the source, drain, and gate electrodes are arranged on their respective layers; 27V with the former and 15V with the latter. As for the saturation output at 6GHz, it was given at 7.5W with the former and at 4W with the latter, also showing substantial improvement.

Now we will describe still another embodiment in the order of processes with reference to FIGS. 3A to 3F.

Figure 3A:
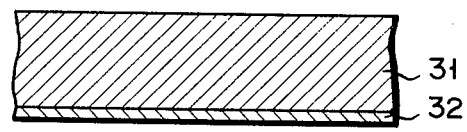
FIGS. 3A to 3F are sectional views showing a manufacturing process for illustrating still another embodiment.
Figure 3B:
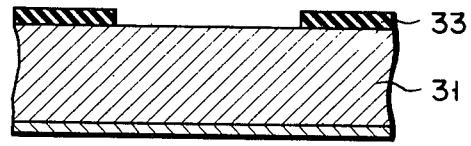
Figure 3C:
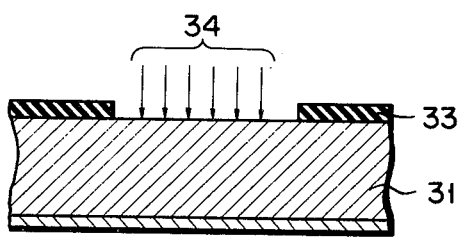
Figure 3D:
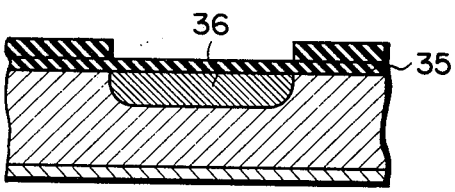
Figure 3E:
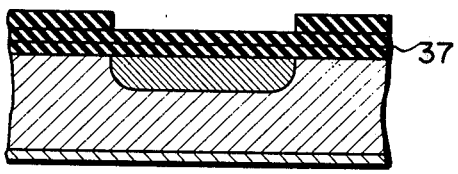
Figure 3F:
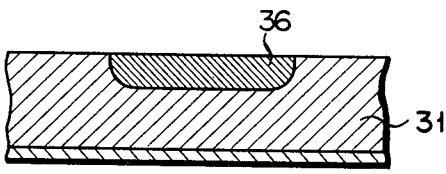

As shown in FIG. 3A, AuGe is evaporated and applied to the back side of a Cr-doped semi-insulating GaAs substrate 31 with the surface bearing of (100) face the specific resistance of approximately $10^8$ $\Omega°cm$, which is heated and alloyed in $H_2$ at 450° C for 5 minutes to form an alloy layer 32. Subsequently, a mask of positive-type resist is formed on the top face of the substrate 31, and a 4,000A thick first anodized film 33 is formed optionally on the substrate 31 by using such mask, thereafter removing the resist as shown in FIG. 3B. Then, as shown in FIG. 3C, Se is injected in the exposed surface of the substrate 31 through an opening of the first anodized film 33 by hot ion-plantation following arrows as designated by numeral 34. This ion-plantation was performed at a heating temperature of 200° C with Se doping rate of $10^{13}$ ions/cm$^2$ and energy at 200KeV. Further, a second anodized film 35 is formed on the top face of the substrate 31 by the anodic oxidation method, and as shown in FIG. 3D, an n-type diffused layer 36, with the depth of 0.2 $\mu m$ and concentration of electrons of $1.5 \times 10^{17} cm^{-3}$, is formed by activating the Se ions previously injected in the surface of the substrate 31 after annealing at 800° C, the film 35 as an encapsulation mask. Additionally, a third anodized film 37 is formed on the top face of the substrate 31 as shown in FIG. 3E, and then it is dissolved completely with hydrochloric acid to expose the surface of the substrate 31 and the diffused layer 36 as shown in FIG. 3F.

Thereafter, an electrode may be attached to the diffused layers 36 by the known method to form a diode, or an MOS type field-effect transistor may be formed from such diffused layers 36 prepared beforehand in a pair. It is to be understood that other elements may also be produced by applying a conventional technique in the field.

Although the second anodized film is finally removed in all these embodiments described hereinbefore, a part or whole of such anodized film may, if needed, be left as it is. Now I will describe a preferred embodiment of such case with reference to FIGS. 4A to 4G.

Figure 4A:
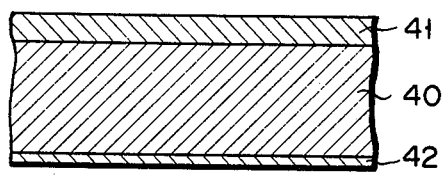
FIGS. 4A to 4G are sectional views for illustrating a method for manufacturing a varactor diode according to a further embodiment.
Figure 4B:
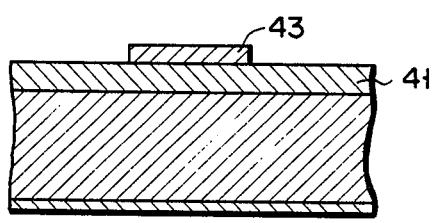
Figure 4C:
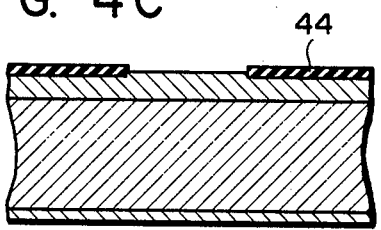
Figure 4D:
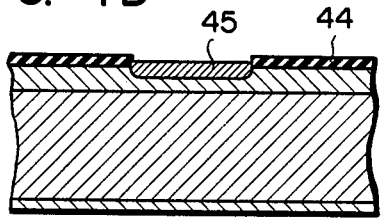
Figure 4E:
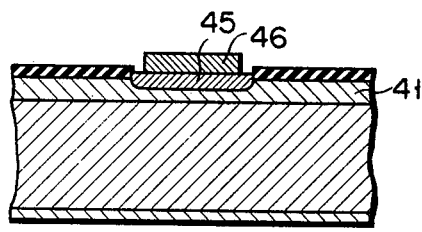
Figure 4F:
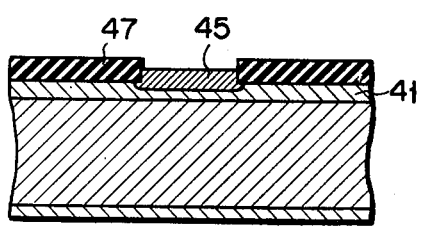
Figure 4G:
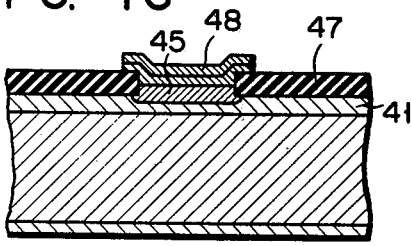

First, as shown in FIG. 4A, an n-type layer 41 is formed on one side of an n+-type GaAs substrate 40 by the epitaxial growth method, while an AuGe alloy layer 42 is formed on the other side by the evaporation method and heating. Then, the n-type layer 41 is coated with photoresist, which is patterned to form a mask 43 as shown in FIG. 4B. Thereafter, a portion of the n-type layer 41 not covered with the mask 43 is oxidized to form a first anodized film 44 by the same anodic oxidation method as in the abovementioned embodiments, and the mask 43, as shown in FIG. 4C, is removed from the n-type layer 41 to expose partially the layer 41 as shown in FIG. 4C. On such exposed portion is diffused Zn at a diffusing temperature of 730° C for two hours; with the first anodized film used as a mask, to form a p-type area 45 in the n-type layer 41 as shown in FIG. 4D. By an intense heat at such diffusion, a degenerated layer is caused and a leak current is made to flow between the first anodized film and the n-type layer 41. Subsequently, as shown in FIG. 4E, a photo-resist mask 46 is formed on the p-type diffused area 45, and the peripheral portion of the diffused area 45 and the surface of the n-type layer 41 right under the first anodized film 44 are oxidized by the anodic oxidation method to form a second anodized film 47 including the first anodized layer, then removing the photoresist film 46, as shown in FIG. 4F. Finally, Mo and Au are evaporated successively to form an electrode 48 as shown in FIG. 4G, thus bringing a varactor diode to completion.

Thus formed diode was found to have surpassing properties; no degenerated layer is formed between the insulating layer 47 and the n-type layer 41, and no leak is allowed to appear at the interface between such layers.

Now there will be described the results of examination on the differences in properties between the first and second anodized films in the method of the invention.

A first anodized film was formed on the GaAs substrate under the same conditions as used in the first embodiment, heated at 600° C for one hour, and then removed gradually from top to bottom by the sputtering method. Meanwhile, there were measured the concentrations of O, Ga and As at each predetermined point of time, while the relationship between the concentration ratio of these elements and the sputtering time is indicated by broken lines in FIG. 5. The points indicating the passage of sputtering time of nearly 15 minutes are considered to correspond to the interface between the substrate and the anodized film. As compared with the similar measurement results for the case before heating (not shown), there may be noticed that (a) the concentrations of O and Ga in the insulating film are extraordinarily higher in the vicinity of the interface, (b) the concentration of Ga is extraordinarily lower at the interface, and (c) the concentration of As in the insulating film is lower as a whole. It seems that a degenerated layer is formed at the interface due to such first and second extraordinary changes and that the specific resistance of the insulating film is lowered by a third phenomenon.

Figure 5:
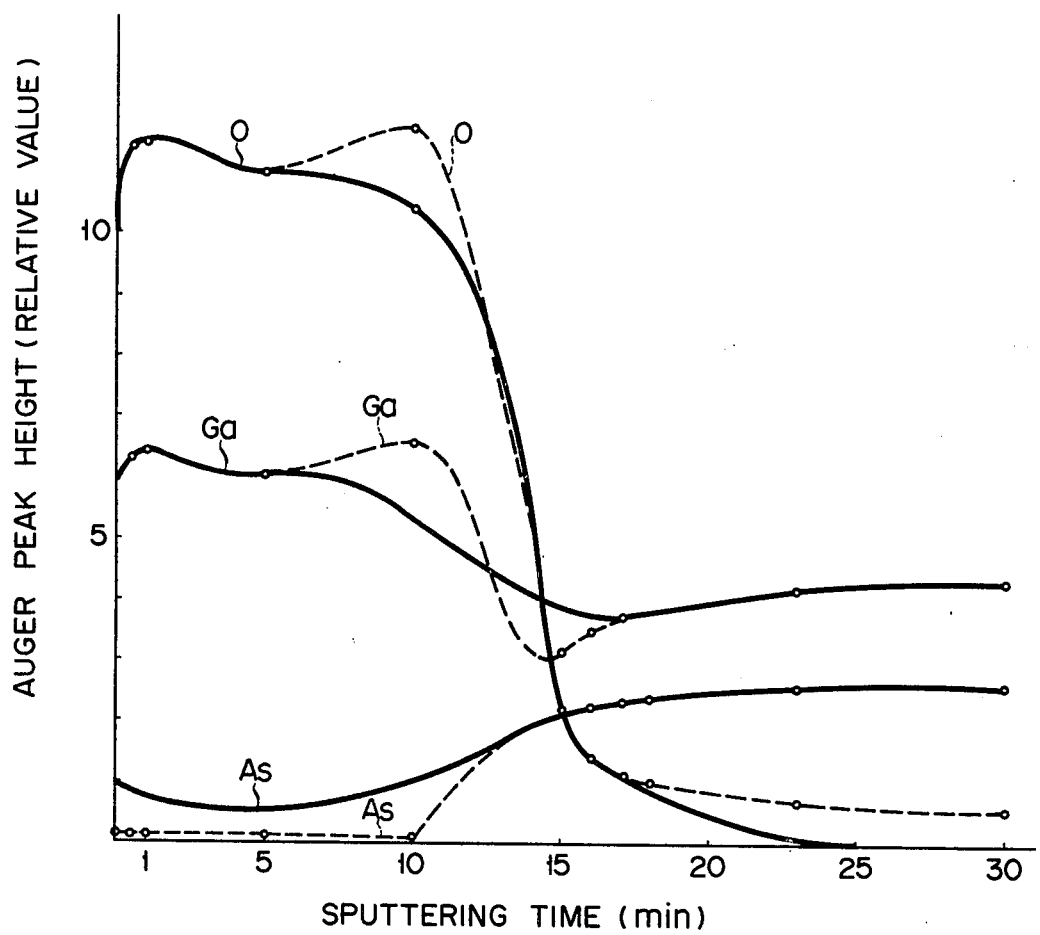
FIG. 5 is a diagram for an easily understanding of the features and advantages of the manufacturing method of this invention.

Further, a second anodized film was formed after the first anodized film was heated in the same manner as described above, while the measurement results of the relative concentrations of the elements, obtained in the aforesaid way, are indicated by full lines in FIG. 5. The measurement was made after thinning the second anodized film approximately to the thickness of the first anodized film. It was revealed from these results that the second anodized film is not subject to such noticeable extraordinary phenomena as mentioned above, approaching the elementary distribution of the first anodized film before heating (not shown).

Although the substrate was formed from GaAs in the method according to the embodiments of the invention as described herein, the method of this invention may also be applied to substrates formed from other compound semiconductors such as GaP. Further, it is to be understood that the method for forming the first oxidized film on the substrate is not limited to said anodic oxidation method, and that there may be employed prior art methods for oxidizing the surface of the substrate, such as plasma anodic oxidation method, thermal oxidation method, etc.

What we claim is:

1. A method for manufacturing a semiconductor device comprising a step of preparing a compound semiconductor body, forming an oxidized film on a surface of said body by oxidizing said surface, heating said body with said oxidized film formed thereon, and forming an anodized film including said oxidized film on the surface of said body by anodizing said surface.

2. A method according to claim 1 further comprising a step of removing said anodized film from said compound semiconductor body by etching with an etchant.

3. A method according to claim 1 wherein said step for forming said oxidizing film is a process for forming an oxidized film selectively on said surface of said compound semiconductor body, and said heating step is a process for creating a diffused area by diffusing impurities in said body with said oxidized film as a mask.

4. A method according to claim 3 wherein said step of preparing said compound semiconductor body includes preparing a compound semiconductor substrate and forming an electrode layer on one side of said substrate, and said step of forming said oxidized film is a process for forming an anodized film selectively on the opposite side of the substrate by the anodic oxidation method with said substrate as an electrode.

5. A method according to claim 1 wherein said step of forming said oxidized film is a process for forming an insulating film selectively on one surface of said compound semiconductor body by the anodic oxidation method, and which further includes a step of providing an area by injecting impurity-ions in said body with said insulating film as a mask.

6. A method according to claim 1 wherein said step of preparing said compound semiconductor body includes preparing a GaAs substrate with a (100) surface as the principal surface.

* * * * *